(12) United States Patent
Liang et al.

(10) Patent No.: US 9,478,552 B2
(45) Date of Patent: Oct. 25, 2016

(54) STATIC RANDOM ACCESS MEMORY AND MANUFACTURING METHOD THEREOF

(71) Applicant: Powerchip Technology Corporation, Hsinchu (TW)

(72) Inventors: Yi-Chung Liang, Tainan (TW); Chen-Hao Huang, Miaoli County (TW); Li-Wei Liu, Kaohsiung (TW); Hann-Ping Hwang, Hsinchu (TW)

(73) Assignee: Powerchip Technology Corporation, Hsinchu (TW)

( * ) Notice: Subject to any disclaimer, the term of this patent is extended or adjusted under 35 U.S.C. 154(b) by 109 days.

(21) Appl. No.: 14/599,545

(22) Filed: Jan. 19, 2015

(65) Prior Publication Data
US 2016/0148939 A1    May 26, 2016

(30) Foreign Application Priority Data

Nov. 20, 2014   (TW) .............................. 103140239 A (51) Int. Cl.
| | | |
|---|---|---|
| *H01L 27/11* | (2006.01) | |
| *G11C 11/417* | (2006.01) | |
| *H01L 29/06* | (2006.01) | |
| *H01L 21/308* | (2006.01) | |
| *H01L 21/3065* | (2006.01) | |
| *H01L 21/306* | (2006.01) | |
| *H01L 29/423* | (2006.01) | |
| *H01L 21/8234* | (2006.01) | |

(52) U.S. Cl.
CPC .......... *H01L 27/1104* (2013.01); *G11C 11/417* (2013.01); *H01L 21/3065* (2013.01); *H01L 21/3083* (2013.01); *H01L 21/30604* (2013.01); *H01L 21/823456* (2013.01); *H01L 29/0642* (2013.01); *H01L 29/4236* (2013.01); *H01L 29/42364* (2013.01); *H01L 29/42376* (2013.01)

(58) Field of Classification Search
CPC . H01L 27/1104; H01L 27/11; H01L 29/4236
See application file for complete search history.

(56) References Cited

U.S. PATENT DOCUMENTS

| | | | |
|---|---|---|---|
| 5,793,670 A * | 8/1998 | Wada ...................... | G11C 11/41 257/205 |
| 6,818,946 B1 | 11/2004 | Venkatraman | |
| 7,189,627 B2 | 3/2007 | Wu et al. | |
| 7,781,278 B2 | 8/2010 | Zhu | |
| 8,058,690 B2 * | 11/2011 | Chang ................... | H01L 21/845 257/369 |
| 2006/0214212 A1* | 9/2006 | Horita ................. | H01L 27/0207 257/300 |
| 2007/0063278 A1* | 3/2007 | Doris ................... | H01L 27/1104 257/347 |
| 2007/0108528 A1* | 5/2007 | Anderson ............... | H01L 27/11 257/365 |
| 2008/0122013 A1* | 5/2008 | Schepis ................. | H01L 21/845 257/401 |
| 2008/0157225 A1* | 7/2008 | Datta ..................... | H01L 27/105 257/401 |

(Continued)

FOREIGN PATENT DOCUMENTS

TW           257889         9/1995

OTHER PUBLICATIONS

Office Action of Taiwan Counterpart Application, issued on Aug. 1, 2016, p. 1-p. 3.

*Primary Examiner* — Michele Fan
(74) *Attorney, Agent, or Firm* — Jianq Chyun IP Office (57) ABSTRACT

A static random access memory and the manufacturing method thereof are provided. By forming the specific gate structure(s) to be concave gate structure(s) and by adjusting the ratio of the effective channel width for these gate structures, the performance of the static random access memory is enhanced.

14 Claims, 5 Drawing Sheets

(56) References Cited

U.S. PATENT DOCUMENTS

| | | | |
|---|---|---|---|
| 2010/0259971 A1* | 10/2010 | Liaw | G11C 8/16 365/154 |
| 2013/0069112 A1* | 3/2013 | Zhu | H01L 21/845 257/192 |
| 2013/0069167 A1* | 3/2013 | Zhu | H01L 21/823431 257/369 |
| 2014/0191323 A1* | 7/2014 | Bergendahl | H01L 21/823431 257/368 |
| 2015/0009750 A1* | 1/2015 | Schaefer | G11C 11/412 365/156 |

* cited by examiner

STATIC RANDOM ACCESS MEMORY AND MANUFACTURING METHOD THEREOF

CROSS-REFERENCE TO RELATED APPLICATION

This application claims the priority benefit of Taiwan application serial no. 103140239, filed on Nov. 20, 2014. The entirety of the above-mentioned patent application is hereby incorporated by reference herein and made a part of this specification.

BACKGROUND OF THE INVENTION

1. Field of the Invention

The present invention generally relates to a static random access memory (SRAM) and the manufacturing method thereof, in particular, to a static random access memory with increased effective channel width and the manufacturing method thereof.

2. Description of Related Art

In order to increase the effectiveness of the integrated circuit and to reduce its production costs, the size of the integrated circuit keeps decreasing and the integration and density of the component or device gradually increase. For the memory, the increased memory cell density leads to smaller structures of the device or smaller pitch or distance between the devices. Generally, smaller design rules, along with the modification in the layout, the design and the structure have to be applied to form the device reduced in size but maintained its efficiency. Under the circumstances that the size of the current device is quite small, it is difficult to further reduce the overall size of the device or change the layout or design of the element.

Therefore, it is desirable for the industry to produce the memory with better performance, without the need to reduce the device size or tightening the layout or the design rules of the element.

SUMMARY OF THE INVENTION

The present invention provides a static random access memory (SRAM) and the manufacturing method thereof. By forming the gate structures in different regions of the SRAM as concave gate structures, the ratio of the effective channel width of different gate structures may be changed, for enhancing the performance of the SRAM.

The present invention provides a static random access memory cell. The static random access memory cell includes a semiconductor substrate, a gate oxide layer and a conductive material layer. The semiconductor substrate includes at least one pull-down transistor region, at least one pull-up transistor region and at least one passing gate transistor region. The semiconductor substrate includes a plurality of isolation structures, the plurality of isolation structures define first active regions, second active regions and third active regions respectively in the at least one pull-down transistor region, the at least one pull-up transistor region and the at least one passing gate transistor region, and the first active regions include a plurality of first trenches, and the third active regions include a plurality of third trenches. The gate oxide layer conformally covers the semiconductor substrate and conformally covers inner surfaces of the first trenches in the at least one pull-down transistor region and inner surfaces of the third trenches in the at least one passing gate transistor region. The conductive material layer includes first gate structures located in the at least one pull-down transistor region, second gate structures located in the at least one pull-up transistor region and third gate structures located in the at least one passing gate transistor region. The conductive material layer is disposed on the gate oxide layer and fills up the first trenches in the at least one pull-down transistor region and the third trenches in the at least one passing gate transistor region. The first gate structure has a first effective channel width, the second gate structure has a second effective channel width and the third gate structure has a third effective channel width, the first effective channel width is larger than the third effective channel width, and the third effective channel width is larger than the second effective channel width.

The present invention provides a method for forming a static random access memory cell. At first, a semiconductor substrate including a plurality of isolation structures is provided. The semiconductor substrate includes at least one pull-down transistor region, at least one pull-up transistor region and at least one passing gate transistor region, and the plurality of isolation structures define first active regions, second active regions and third active regions respectively in the at least one pull-down transistor region, the at least one pull-up transistor region and the at least one passing gate transistor region. Then a patterned mask layer is formed over the semiconductor substrate. The patterned mask layer includes a first pattern, a second pattern and a third pattern respectively in the at least one pull-down transistor region, the at least one pull-up transistor region and the at least one passing gate transistor region, and the first pattern includes a plurality of first openings corresponding to the first active regions, the third pattern includes a plurality of third openings corresponding to the third active regions. A plurality of first trenches is formed in the at least one pull-down transistor region under the plurality of first openings and a plurality of third trenches is formed in the at least one passing gate transistor region under the plurality of third openings using the patterned mask layer as an etching mask to etch the semiconductor substrate. After forming a gate oxide layer conformally covering the semiconductor substrate and conformally covering inner surfaces of the first trenches in the at least one pull-down transistor region and inner surfaces of the third trenches in the at least one passing gate transistor region, a conductive material layer is formed covering the gate oxide layer and filling up the first trenches in the at least one pull-down transistor region and the third trenches in the at least one passing gate transistor region. The conductive material layer and the gate oxide layer are patterned to form first gate structures, second gate structures and third gate structures respectively in the at least one pull-down transistor region, the at least one pull-up transistor region and the at least one passing gate transistor region. The first gate structure has a first effective channel width, the second gate structure has a second effective channel width and the third gate structure has a third effective channel width. The first effective channel width is larger than the third effective channel width, and the third effective channel width is larger than the second effective channel width.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts. In the following embodiment, a circuit trace part of a portable device is described as an example for illustration. It is not intended to limit the method or the part structure by the exemplary embodiments described herein.

Figure 1:
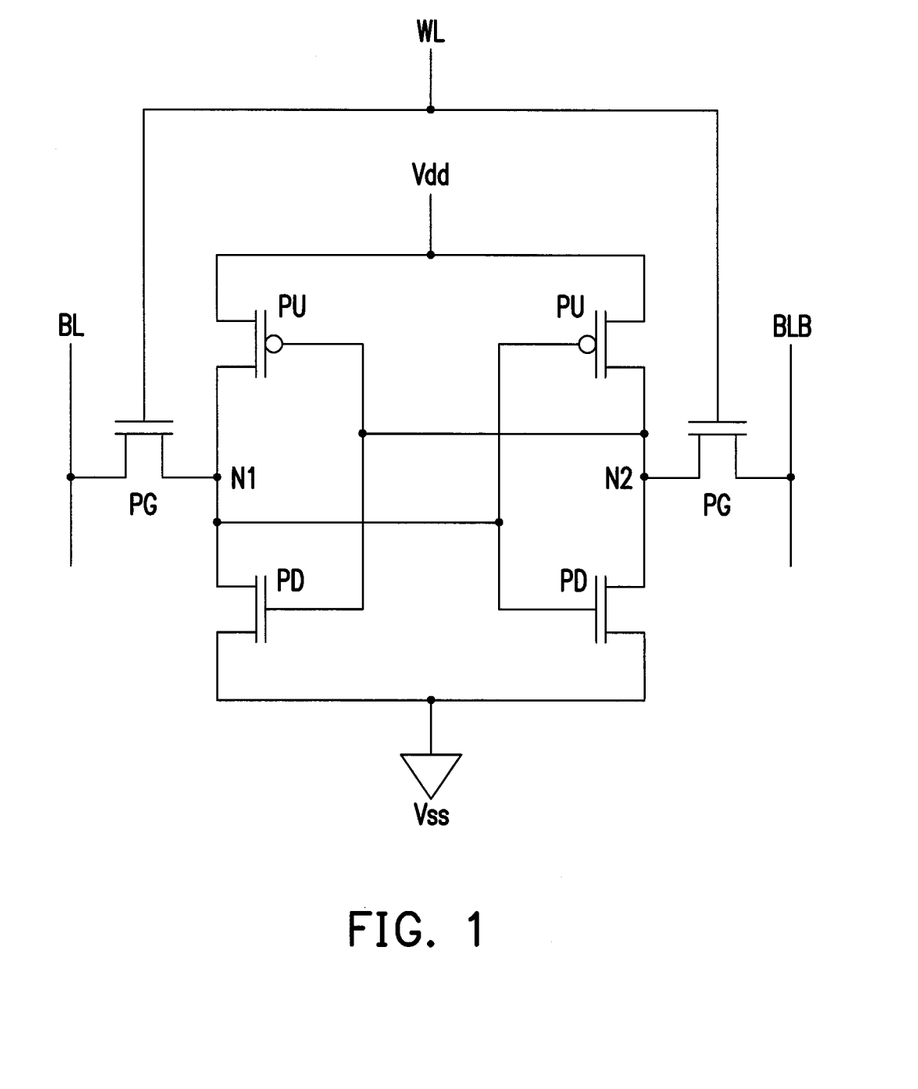
FIG. 1 shows the representative circuit diagram of a static random access memory cell.

In general, as shown in FIG. 1, a static random access memory (SRAM) cell has 6 transistors is described. The SRAM cell includes a cross-coupled inverter consisting of two PMOS as the pull-up transistors PU and two NMOS as the pull-down transistors PD connected together. The gate/drain of each PMOS pull-up transistor PU are respectively connected with the gate/drain of the corresponding NMOS pull-down transistor PD, so as to form the invertor. The source of the pull-up transistor PU is connected to a high reference voltage, usually Vdd, while the source of the pull-down transistor PD is connected to a low reference voltage, usually Vss, or the ground. The state of the SRAM cell basically can be read through selectively connecting the charge storage points N1, N2 of the memory cell with the complimentary pair of bit-lines (BL, BLB). A pair of the passing gate transistors PG is connected with the charge storage points N1, N2 of the memory cell and the corresponding bit-lines (BL, BLB).

The present invention provides a static random access memory (SRAM) and the manufacturing method thereof.

FIG. 2A-FIG. 2E illustrate the schematic cross-sectional views of the manufacturing process steps of a static random access memory cell according to one embodiment of the present invention. From FIG. 2A-FIG. 2E, the region A is shown as the cross-sectional view of the pull-down transistor PD region in FIG. 1, the region B is shown as the cross-sectional view of the pull-up transistor PU region of FIG. 1, and the region C is shown as the cross-sectional view of the passing gate transistor PG region of FIG. 1.

Figure 2A:
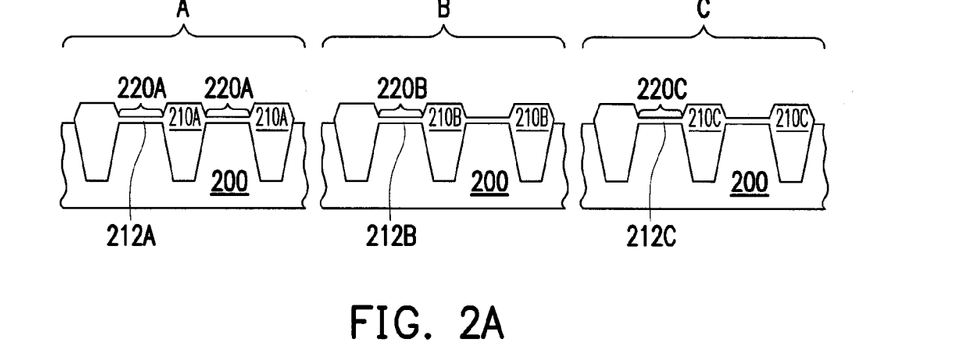
FIG. 2A-FIG. 2E illustrate the schematic cross-sectional views of the manufacturing process steps of a static random access memory cell according to one embodiment of the present invention.

Referring to FIG. 2A, a substrate 200 is firstly provided. The substrate 200 includes regions A, B, C, for example. The region A is shown as the cross-sectional view of the pull-down transistor PD region in FIG. 1, the region B is shown as the cross-sectional view of the pull-up transistor PU region of FIG. 1, and the region C is shown as the cross-sectional view of the passing gate transistor PG region of FIG. 1.

Later, the isolation structure 210A is formed within the region A and in the substrate 200, the isolation structure 210B is formed within the region B and in the substrate 200, while the isolation structure 210C is formed within the region C and in the substrate 200. The isolation structures 210A, 210B and 210C respectively define the active regions 220A, 220B and 220C in the regions A, B and C of the substrate 200. In addition, the liner oxide layers 212A, 212B and 212C are formed respectively on the surfaces of the active regions 220A, 220B and 220C. The top surfaces of the isolation structures 210A, 210B and 210C may be higher than those of the liner oxide layers 212A, 212B and 212C, for example. The material of the liner oxide layers 212A, 212B and 212C may be silicon oxide, for example, formed by any applicable methods. Depending on the characteristics of the memory device or the design of the product, the liner oxide layer 212A, 212B or 212C may be of the same thickness or different thickness. In this embodiment, it is exemplary that the liner oxide layers in different regions are of the same thickness, however the modification or variations are encompassed within the scope of the present invention.

Figure 2B:
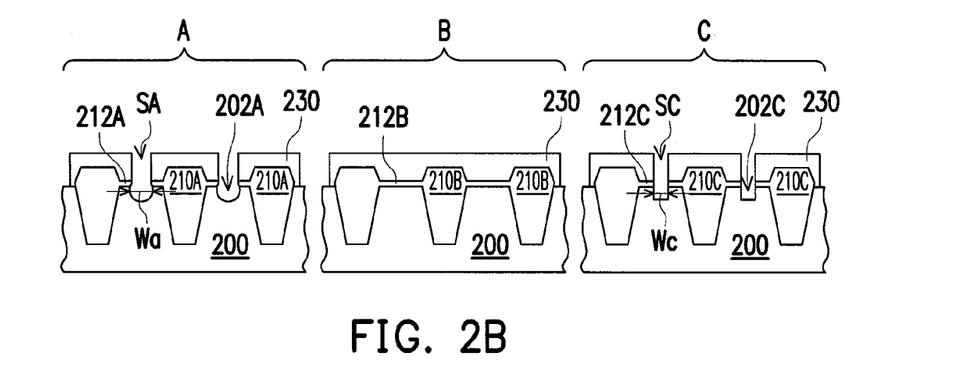

Referring to FIG. 2B, a patterned mask layer 230 is formed over the whole substrate 200, covering the isolation structures 210A, 210B and 210C and the liner oxide layers 212A, 212B and 212C. For the region A, B or C, the patterned mask layer 230 has different designs of the patterns. For example, in this embodiment, the photoresist layer 230 in the region A includes openings SA and the photoresist layer 230 in the region C includes openings SC, exposing the underlying liner oxide layers, while the photoresist layer 230 in the region B has no openings but fully covers the underlying liner oxide layer 212B. In this embodiment, the width Wa of the openings SA is larger than the width Wc of the openings SC. The patterned mask layer 230 may be a patterned photoresist layer or a hard mask layer, such as a silicon nitride layer, for example.

Referring to FIG. 2B, the patterned mask layer 230 is then used as the etching mask to etch off the exposed liner oxide layers 212A, 212C that are exposed by the openings SA, SC, and further remove the substrate 200 partially to form a plurality of trenches 202A, 202C in the substrate 200. In this embodiment, if wet etching is performed to the region A to form the trenches 202A in the substrate 200, because wet etching is isotropic etching and the etching directions are targeted to all directions, the resultant trenches 202A should have an U-shape or a round profile, and the width Wa of the trenches 202A should be larger or equivalent to the width of the openings SA. As a contrast, if dry etching is performed to the region C to form the trenches 202C in the substrate 200, because dry etching is anisotropic etching, the resultant trenches 202C have a substantially vertical profile, and the width Wc of the trenches 202C is substantially equivalent to the width of the openings SC.

In addition, in this embodiment, although different etch process are described to be performed to different regions, it is also understood by one of ordinary skill in this field that the same type of etching processes may be performed to different regions of the same substrate, i.e., wet etching used for all regions or dry etching used for all regions. For the SRAM structure, even if the same type of etching processes is performed to different regions, under the condition of forming the trenches in the same depth, the width of the openings SA in the region A is greater than the width of the openings SC in the region C, to ensure the formed trenches 202A are wider than the trenches 202C, i.e., the width Wa is larger than the width Wc.

Figure 2C:
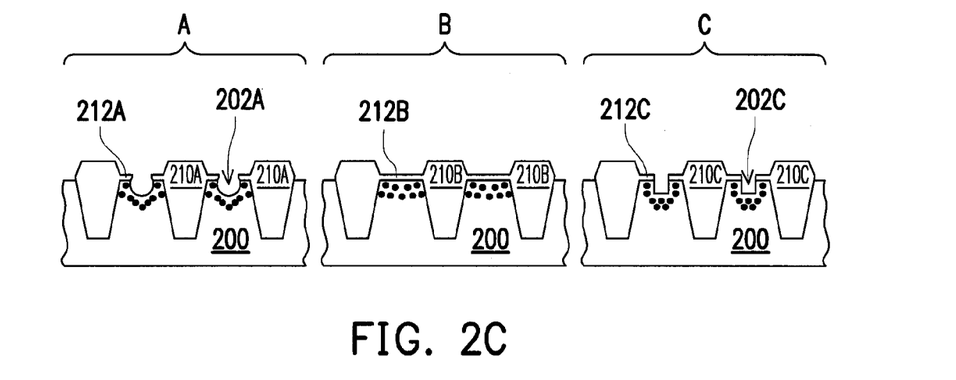

Later, referring to FIG. 2C, after removing the patterned mask layer 230, ion implantation is performed to the active regions 220A, 220B and 220C, so that dopants are implanted to the channel regions under the liner oxide layers 212A, 212B and 212C to form channel implants. The method for removing the patterned mask layer 230 includes wet etching or dry etching, for example.

Figure 2D:
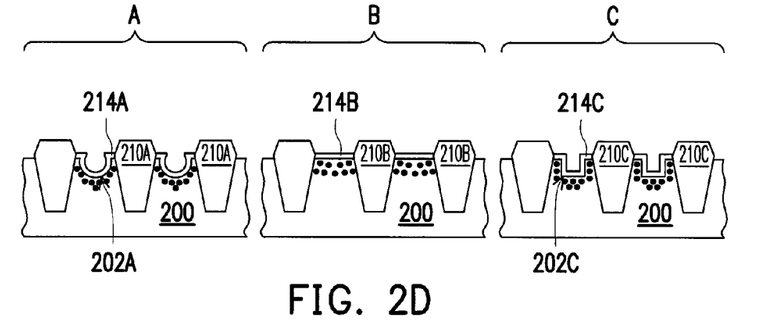

Referring to FIG. 2D, after removing the liner oxide layers 212A, 212B and 212C, the gate oxide layer 214 is formed, including the gate oxide layers 214A, 214B and 214C respectively formed on the exposed surfaces of the active regions 220A, 220B and 220C, the gate oxide layers 214A and 214C formed in the regions A and C conformally covering the surface of the substrate 200 and the inner surfaces of the trenches 202A and 202C (covering the bottom surfaces and the side surfaces of the trenches but not filling up the trenches) in the regions A and C. In other words, the gate oxide layers 214A and 214C in the regions A and C are conformal to the surface of the substrate 200 and the inner surfaces of the trenches 202A and 202C. For example, the gate oxide layers 214A, 214B and 214C may be formed by thermal oxidation and a thickness of the gate oxide layers 214A, 214B and 214C may range between 20-30 Angstroms. The method for removing the liner oxide layers 212A, 212B and 212C may include etching with HF.

Figure 2E:
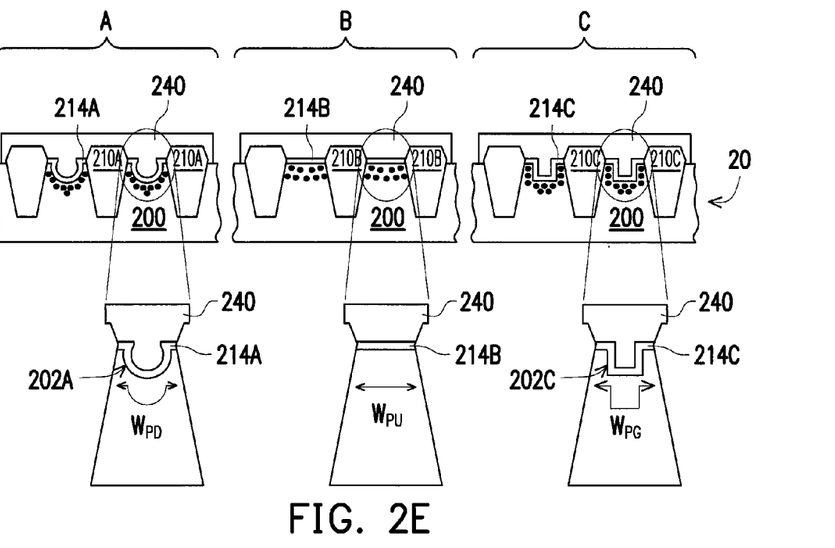

Referring to FIG. 2E, a conductive material layer 240 is formed over the whole substrate 200, covering the gate oxide layers 214A, 214B and 214C and filling up the trenches 202A and 202C in the regions A and C. The conductive material layer 240 functions later as the gate layer. Then a patterning process is performed to pattern the conductive material layer 240 and the gate oxide layers 214A, 214B and 214C, so as to form the gate structures in the regions A, B, C respectively, thus completing the fabrication of the SRAM cell 20. The subsequent backend processes including the deposition of the dielectric layers, insulating layers and/or the formation of the contacts are known to the artisan and will not be described in details herein. The material of the conductive material layer 240 may be doped polysilicon or polycide, for example. The conductive material layer 240 constituted by doped polysilicon may be formed by forming an undoped polysilicon layer by CVD and then ion implantation, or forming by CVD with in-situ doping.

Referenced with the 6-transistor SRAM cell of FIG. 1 and FIG. 2A-2E, the region A is shown as the cross-sectional view of the pull-down transistor PD region in FIG. 1, the region B is shown as the cross-sectional view of the pull-up transistor PU region of FIG. 1, and the region C is shown as the cross-sectional view of the passing gate transistor PG region of FIG. 1. That is, the conductive material layer 240 in the region A of SRAM cell 20 in FIG. 2E functions as the gate structure of the pull-down transistor PD, the conductive material layer 240 in the region B functions as the gate structure of the pull-up transistor PU, while the conductive material layer 240 in the region C functions as the gate structure of the passing gate transistor PG.

Referring to the lower part of FIG. 2E, the partial enlarged views of the regions A, B and C are shown. It is seen that there is no trench formed in the region B. The gate oxide layer 214B simply covers the surface of the active region 220B in the region B, and the conductive material layer 240 covers the planar surface of the gate oxide layer 214B in the region B. Because the trenches 202A and trenches 202C are formed in the regions A and C, the gate oxide layers 214A and 214C are concave and the subsequent formed conductive material layer 240 in the regions A and C is filled into the trenches (having T-shaped cross-section), so-called concave gate structures. In the region A or C, owing to the trenches 202A or 202C, the resultant gate oxide layer 214A or 214C covers conformally not only the surface of the substrate 200 but also the inner surfaces of the trenches 202A or 202C (covering the bottom surfaces and the side surfaces of the trenches but not filling up the trenches), so that the contact region between the gate oxide layer 214A/214C and the conductive material layer 240 (i.e. the effective channel width $W_{PD}$ or $W_{PG}$) is larger than the contact region between the gate oxide layer 214B and the conductive material layer 240 (i.e. the effective channel width $W_{PU}$). Furthermore, because the width of the trenches 202A in the region A is larger than the width of the trenches 202C in the region C, under the premise of the same depth of the trenches, the contact region between the gate oxide layer 214A and the conductive material layer 240 (i.e. the effective channel width $W_{PD}$) is larger than the contact region between the gate oxide layer 214C and the conductive material layer 240 (i.e. the effective channel width $W_{PG}$).

Figure 3:
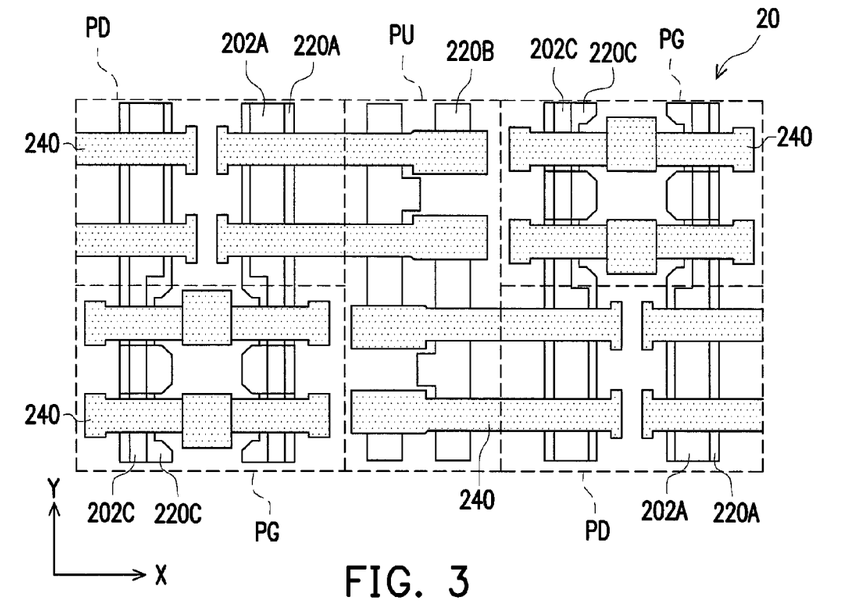
FIG. 3 illustrates the schematic top view of the layout of the static random access memory cell structure.

Referring to FIG. 2E and FIG. 3, the static random access memory cell 20 includes the semiconductor substrate 200, and the semiconductor substrate 200 includes at least one pull-down transistor PD region, at least one pull-up transistor PU region and at least one passing gate transistor PG region. The semiconductor substrate 200 includes a plurality of isolation structures 210A, 210B, 210C, and the isolation structures 210A, 210B, 210C define the first, the second and the third active regions 220A, 220B, 220C respectively in the pull-down transistor PD region(s), the pull-up transistor PU region(s) and the passing gate transistor PG region(s). The first active region 220A includes a plurality of first trenches 202A, and the third active region 220C includes a plurality of third trenches 202C. The SRAM cell 20 in this disclosure further comprises a gate oxide layer 214 conformally covering the substrate 200 and conformally covering the inner surfaces of the first trenches 202A in the pull-down transistor PD region and the inner surfaces of the third trenches 202C of the passing gate transistor PG region. The SRAM cell 20 in this disclosure further comprises a conductive material layer 240, and the conductive material layer 240 includes the first gate structure in the pull-down transistor PD region, the second gate structure in the pull-up transistor PU region and the third gate structure in the passing gate transistor PG region. The conductive material layer 240 is located on the gate oxide layer and fills up the first trenches 202A in the pull-down transistor PD region and the third trenches 202C in the passing gate transistor PG region. The first gate structure has a first effective channel width $W_{PD}$, the second gate structure has a second effective channel width $W_{PU}$, and the third gate structure has a third effective channel width $W_{PG}$. The first effective channel width $W_{PD}$ is larger than the third effective channel width $W_{PG}$, and the third effective channel width $W_{PG}$ is larger than the second effective channel width $W_{PU}$.

In this disclosure, through forming the trenches or not forming the trenches in the active regions of the substrate, or by adjusting the depth or width of the trenches in different regions, the effective channel width of the gate structure(s) in different regions (i.e. the pull-down transistor PD region, pull-up transistor PU region, passing gate transistor PG region) is modified. Principally, one design point of the SRAM cell is to have the effective channel width in the width direction of the gate structure(s) in the pull-down transistor PD region, the pull-up transistor PU region, the passing gate transistor PG region follow the rule: $W_{PD}>W_{PG}>W_{PU}$.

Figure 2F:
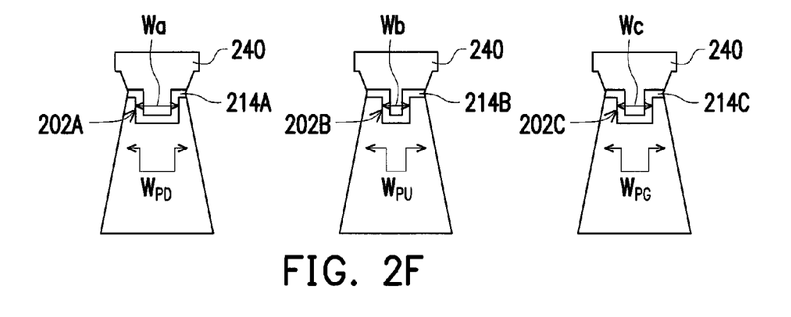
FIG. 2F illustrates the schematic cross-sectional view of a portion of a static random access memory cell according to another embodiment of the present invention.

FIG. 2F illustrate the schematic cross-sectional view of a static random access memory cell according to another embodiment of the present invention. Referring to the lower part of FIG. 2F, the partial enlarged views of the regions A, B and C are shown. Referring to FIG. 2F, in another embodiment, the pull-down transistor PD region, the pull-up transistor PU region and the passing gate transistor PG region are designed to have the trenches 202A, 202B, 202C formed therein respectively. Under the premise that the trenches have the substantially the same depth, the trenches 202A has a width Wa larger than a width Wc of the trenches 202C, while the width Wc of the trenches 202C is larger than a width Wb of the trenches 202B. Therefore, such design still follow the rule: the effective channel width in the width direction of the gate structure(s) in the pull-down transistor PD region, the pull-up transistor PU region, the passing gate transistor PG region $W_{PD}>W_{PG}>W_{PU}$.

If using the effective channel width $W_{PU}$ of the gate structure in the pull-up transistor PU region as the basic unit, the effective channel width $W_{PD}$ of the gate structure in the pull-down transistor PD region or the effective channel width $W_{PG}$ of the gate structure in the passing gate transistor PG region should be larger than $W_{PU}$, and preferably $W_{PD}$ or $W_{PG}$ is designed to be equivalent to or less than 4 times of $W_{PU}$. Although the previous case discusses the width of the trenches in different regions based the presumption of the same depth of the trenches, the scope of this disclosure also includes the design of different depths of the trenches. Under the circumstances that the line-width is limited, certain trenches can be designed to be deeper if unable to be made wider, as long as it follows the rule $W_{PD}>W_{PG}>W_{PU}$.

FIG. 3 illustrates the schematic top view of the layout of the static random access memory cell. In FIG. 3, the dotted regions PD, PU, PG respectively represent the layout of the pull-down transistor PD region, the pull-up transistor PU region and the passing gate transistor PG region. From FIG. 3, the width of the trenches 202A in the width direction (X-direction) of the region PD is larger than the width of the trenches 202C of the region PG. There is no trench formed in the active region 220B of the region PU.

The performance of SRAM may be evaluated by various parameters, including the read static noise margin (RSNM) β, the write static noise margin (WSNM) γ and the reading current I read. In general, the static noise margin (SNM) is used for quantify the DC noise of invert memory cell, and then evaluate the stability of memory cell. The definitions of the parameters:

$$\beta = (PD\,W/L)/(PG\,W/L) \qquad \text{RSNM:}$$

$$\gamma = (PG\,W/L)/(PU\,W/L) \qquad \text{WSNM:}$$

Reading current I read: PD Ids and PG Ids represent respectively the saturation current under the normal operation of PD and PG, and the larger Ids means the faster reading speed of SRAM.

Figure 4:
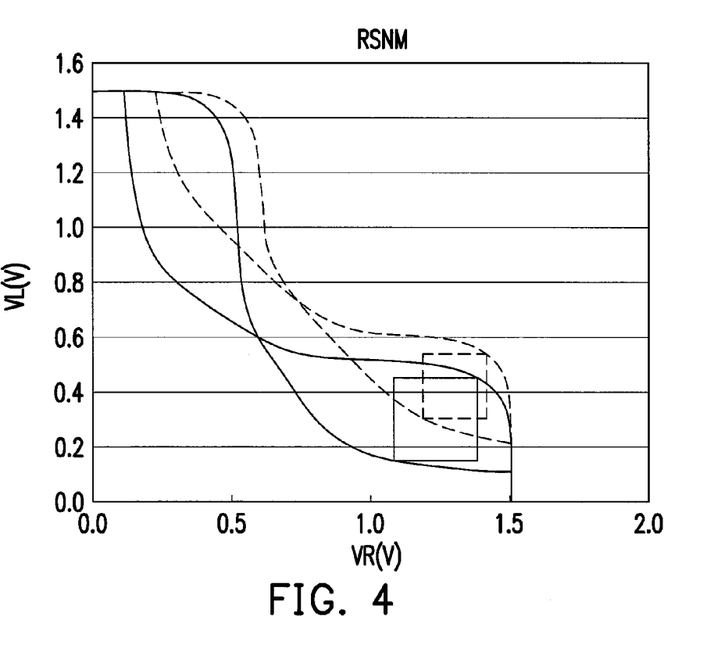
FIG. 4 shows the voltage transfer curve of the invertor on reading the SRAM cell.

FIG. 4 illustrates the voltage transfer curve (VTC) of the invertor on reading the SRAM cell, and the largest square area within the butterfly curve represents the value of RSNM. The right curve (dotted line) in FIG. 4 represents the control group, the ratio of $W_{PD}$ to $W_{PG}$ is designed to be normal ($W_{PD}/W_{PG}$ is about 1.5) and the obtained RSNM value is 0.45V. As shown in the left curve of FIG. 4, $W_{PD}$ is larger and $W_{PG}$ is smaller than the control (i.e. the ratio of $W_{PD}$ to $W_{PG}$, $W_{PD}/W_{PG}$, is larger, in this embodiment $W_{PD}/W_{PG}$ is about 2.1 (40% larger), and the RSNM value increases to 0.62V, which means higher Read Stability.

Figure 5:
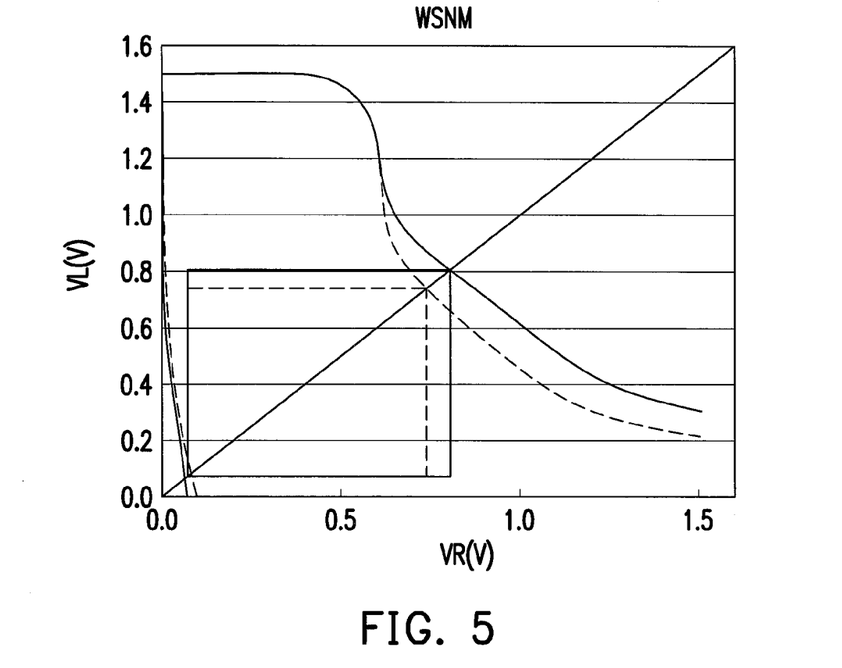
FIG. 5 shows the voltage transfer curve of the invertor on writing into the SRAM cell.

FIG. 5 illustrates the voltage transfer curve (VTC) of the invertor on writing the SRAM cell, and the largest square area within the butterfly curve represents the value of WSNM. The left curve (dotted line) in FIG. 5 represents the control group, the ratio of $W_{PG}$ to $W_{PU}$ is designed to be normal ($W_{PG}/W_{PU}$ is about 1) and the obtained WSNM value is 0.93V. As shown in the right curve of FIG. 5, $W_{PG}$ is larger and $W_{PU}$ is smaller than the control (i.e. the ratio of $W_{PG}$ to $W_{PU}$, $W_{PG}/W_{PU}$, is larger, in this embodiment $W_{PG}/W_{PU}$ is about 1.2 (20% larger), and the WSNM value increases to 1.05V, which means higher write Stability. In fact, even $W_{PG}$ remains unchanged and $W_{PU}$ is smaller (the ratio of $W_{PG}$ to $W_{PU}$, $W_{PG}/W_{PU}$, becomes larger), and the obtained WSNM value increases to 0.95V.

Figure 6:
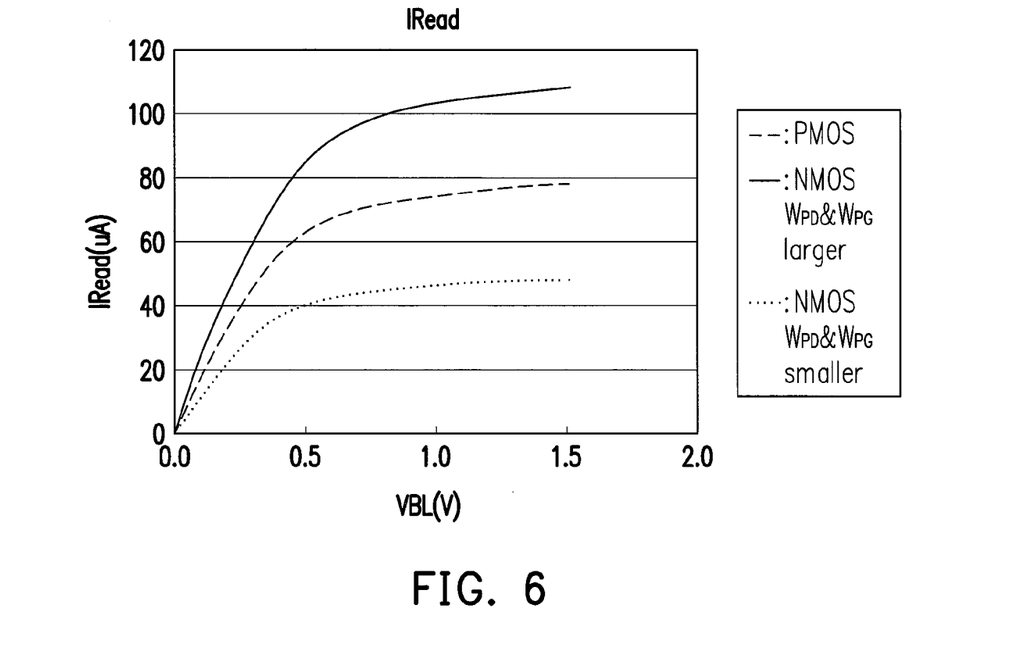
FIG. 6 shows the I-V curve of the reading current of the SRAM cell and the voltage of the bit-line.

FIG. 6 illustrates the I-V curve of the reading current of the SRAM cell and the voltage of the bit-line voltage. In FIG. 6, changing the effective channel width $W_{PU}$ of the pull-up transistor PU (PMOS) has no impact on the reading current and listed as the reference curve (middle curve). However, changing the effective channel width $W_{PD}$ or $W_{PG}$ of the pull-down transistor PD or the passing gate transistor PG (NMOS) has impact on the reading current. If $W_{PD}$ or $W_{PG}$ of the NMOS becomes larger, the reading current becomes larger (the upper curve). On the other hand, if $W_{PD}$ or $W_{PG}$ of the NMOS becomes smaller, the reading current becomes smaller (the lower curve).

The design of SRAM cell of this disclosure follows the rule: the effective channel width in the width direction of the gate structure(s) in the pull-down transistor PD region, the pull-up transistor PU region, the passing gate transistor PG region $W_{PD}>W_{PG}>W_{PU}$.

When the rule $W_{PD}>W_{PG}>W_{PU}$ is satisfied, the performance of the SRAM cell becomes better, not only the stability of the SRAM is enhanced for improved RSNM and WSNM, but also the reading speed of the SRAM is increased due to larger reading current I read.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a static random access memory cell, comprising:

providing a semiconductor substrate, wherein the semiconductor substrate includes a plurality of isolation structures, and the semiconductor substrate includes at least one pull-down transistor region, at least one pull-up transistor region and at least one passing gate transistor region, the plurality of isolation structures define first active regions, second active regions and third active regions respectively in the at least one pull-down transistor region, the at least one pull-up transistor region and the at least one passing gate transistor region;

forming a patterned mask layer over the semiconductor substrate, wherein the patterned mask layer includes a first pattern, a second pattern and a third pattern respectively in the at least one pull-down transistor region, the at least one pull-up transistor region and the at least one passing gate transistor region, and the first pattern includes a plurality of first openings corresponding to the first active regions, the third pattern includes a plurality of third openings corresponding to the third active regions;

using the patterned mask layer as an etching mask to etch the semiconductor substrate, to form a plurality of first trenches in the at least one pull-down transistor region under the plurality of first openings and a plurality of third trenches in the at least one passing gate transistor region under the plurality of third openings;

forming a gate oxide layer conformally covering the semiconductor substrate and conformally covering inner surfaces of the first trenches in the at least one pull-down transistor region and inner surfaces of the third trenches in the at least one passing gate transistor region;

forming a conductive material layer covering the gate oxide layer and filling up the first trenches in the at least one pull-down transistor region and the third trenches in the at least one passing gate transistor region; and patterning the conductive material layer and the gate oxide layer to form first gate structures, second gate structures and third gate structures respectively in the at least one pull-down transistor region, the at least one pull-up transistor region and the at least one passing gate transistor region; wherein the first gate structure has a first effective channel width, the second gate structure has a second effective channel width and the third gate structure has a third effective channel width, the first effective channel width is larger than the third effective channel width, and the third effective channel width is larger than the second effective channel width.

2. The method of claim 1, wherein a width of the first trenches is larger than a width of the third trenches.

3. The method of claim 1, wherein the second pattern includes a plurality of the second the openings corresponding to the second active regions, and a plurality of second trenches is formed in the at least one pull-up transistor region under the plurality of second openings.

4. The method of claim 3, wherein the gate oxide layer conformally covers the semiconductor substrate and conformally covers inner surfaces of the plurality of second trenches in the at least one pull-up transistor region, and the conductive material layer covers the gate oxide layer and fills up the plurality of second trenches in the at least one pull-up transistor region.

5. The method of claim 4, wherein a width of the first trenches is larger than a width of the third trenches, and a width of the third trenches is larger than a width of the second trenches.

6. The method of claim 1, wherein the patterned mask layer is a patterned photoresist layer or a patterned hard mask layer.

7. The method of claim 1, wherein etching using the patterned mask layer as the etching mask includes performing dry etching to etch the semiconductor substrate.

8. The method of claim 1, wherein etching using the patterned mask layer as the etching mask includes performing wet etching to etch the semiconductor substrate.

9. A static random access memory cell, comprising:
a semiconductor substrate, wherein the semiconductor substrate includes at least one pull-down transistor region, at least one pull-up transistor region and at least one passing gate transistor region, the semiconductor substrate includes a plurality of isolation structures, the plurality of isolation structures define first active regions, second active regions and third active regions respectively in the at least one pull-down transistor region, the at least one pull-up transistor region and the at least one passing gate transistor region, and the first active regions include a plurality of first trenches, and the third active regions include a plurality of third trenches;

a gate oxide layer conformally covering the semiconductor substrate and conformally covering inner surfaces of the first trenches in the at least one pull-down transistor region and inner surfaces of the third trenches in the at least one passing gate transistor region; and a conductive material layer, wherein the conductive material layer includes first gate structures located in the at least one pull-down transistor region, second gate structures located in the at least one pull-up transistor region and third gate structures located in the at least one passing gate transistor region, the conductive material layer is disposed on the gate oxide layer and fills up the first trenches in the at least one pull-down transistor region and the third trenches in the at least one passing gate transistor region, wherein the first gate structure has a first effective channel width, the second gate structure has a second effective channel width and the third gate structure has a third effective channel width, the first effective channel width is larger than the third effective channel width, and the third effective channel width is larger than the second effective channel width.

10. The SRAM cell of claim 9, wherein a width of the first trenches is larger than a width of the third trenches.

11. The SRAM cell of claim 9, wherein the second active regions in the at least one pull-up transistor region includes a plurality of the second trenches.

12. The SRAM cell of claim 11, wherein the gate oxide layer conformally covers the semiconductor substrate and conformally covers inner surfaces of the plurality of second trenches in the at least one pull-up transistor region, and the conductive material layer covers the gate oxide layer and fills up the plurality of second trenches in the at least one pull-up transistor region.

13. The SRAM cell of claim 12, wherein a width of the first trenches is larger than a width of the third trenches, a width of the third trenches is larger than a width of the second trenches.

14. The SRAM cell of claim 9, wherein a material of the conductive material layer includes doped polysilicon or polycide.

* * * * *